United States Patent
Hsu et al.

(10) Patent No.: US 9,111,595 B2
(45) Date of Patent: Aug. 18, 2015

(54) MEMORY DEVICE WITH TRACKING WORDLINE VOLTAGE LEVEL CIRCUIT AND METHOD

(71) Applicant: Taiwan Semiconductor Manufacturing Co., Ltd., Hsin-Chu (TW)

(72) Inventors: Yu-Hao Hsu, Tainan (TW); Ming-Chien Tsai, Kaohsiung (TW); Chen-Lin Yang, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 84 days.

(21) Appl. No.: 13/904,653

(22) Filed: May 29, 2013

(65) Prior Publication Data
US 2014/0269141 A1    Sep. 18, 2014

Related U.S. Application Data

(60) Provisional application No. 61/787,204, filed on Mar. 15, 2013.

(51) Int. Cl.
| | |
|---|---|
| G11C 8/08 | (2006.01) |
| G11C 7/06 | (2006.01) |
| G11C 7/12 | (2006.01) |
| G11C 11/419 | (2006.01) |
| G11C 29/50 | (2006.01) |
| G11C 29/52 | (2006.01) |

(52) U.S. Cl.
CPC .. *G11C 8/08* (2013.01); *G11C 7/06* (2013.01); *G11C 7/12* (2013.01); *G11C 11/419* (2013.01); *G11C 29/50* (2013.01); *G11C 29/52* (2013.01)

(58) Field of Classification Search
CPC ........ G11C 11/413; G11C 7/22; G11C 7/227; G11C 8/08; G11C 7/12; G11C 7/06; G11C 29/52; G11C 29/50; G11C 11/419
USPC ............... 365/154, 189.07, 203, 230.06, 194, 365/233.1, 210.1
See application file for complete search history.

(56) References Cited

U.S. PATENT DOCUMENTS

| | | | | |
|---|---|---|---|---|
| 6,643,204 | B1 * | 11/2003 | Agrawal ..................... | 365/210.1 |
| 2002/0186579 | A1 * | 12/2002 | Yokozeki ..................... | 365/154 |
| 2003/0206448 | A1 * | 11/2003 | Sung et al. ............... | 365/189.07 |
| 2010/0046309 | A1 * | 2/2010 | Rengarajan et al. .......... | 365/203 |
| 2010/0188886 | A1 * | 7/2010 | Behrends et al. ............. | 365/154 |

* cited by examiner

*Primary Examiner* — Richard Elms
*Assistant Examiner* — Ajay Ojha
(74) *Attorney, Agent, or Firm* — Duane Morris LLP

(57) ABSTRACT

A memory includes a clock generator for providing a first clock signal responsive to a second clock signal and a feedback signal. A feedback loop provides the feedback signal and includes a tracking wordline, a tracking bitline, a tracking bit cell, and a tracking wordline driver for driving the tracking wordline responsive to the first clock signal. The memory includes a tracking wordline level tuner for reducing a voltage level of a tracking wordline signal on the tracking wordline responsive to a weak bit control signal.

20 Claims, 5 Drawing Sheets

MEMORY DEVICE WITH TRACKING WORDLINE VOLTAGE LEVEL CIRCUIT AND METHOD

CROSS-REFERENCE TO RELATED APPLICATION

This application claims priority under 35 U.S.C. §119(e) from Provisional Application Ser. No. 61/787,204, filed Mar. 15, 2013, the entirety of which is hereby incorporated by reference herein.

BACKGROUND

Memories like SRAM (static random access memory) have large number of memory cells arranged in arrays. A particular memory cell inside an array is typically selected by a wordline and a pair of bitlines. The wordline is typically connected to one or more control gates of every memory cell in a row. In case the control gates are made of NMOS transistors, all the memory cells are turned on when the wordline connected thereto turns to a high voltage, i.e., to be activated. The bitline pair is typically connected to storage nodes of every memory cell in a column to a sense amplifier. The memory cell at the cross point of the activated wordline and the selected bitline pair is the one that is selected.

Memories are conservatively designed to provide enough read margin for reading even the weakest selected bits (e.g., 6-sigma weak-bit at FF/SSG/m40 corner). These weak bits will typically provide about half of the cell current of a normal bit cell, which means that twice as much time is needed to develop the necessary read margin for distinguishing the bit as a logical "1" or "0". For those SRAM macros (memory dies) that do not have these worst-case scenario weak bits, the performance suffers from this conservative design. One approach to addressing this problem involves providing multiple, selectable (depending on whether a weak bit is present or not) timing loops for generating an internal clock reference. However this approach requires complex finite state machine control circuitry and has significant area penalties. A second approach involves providing extra selectable logic delays, typically including long inverter chains. However this approach also has significant area penalties as well as poor tracking ratio and a narrow tuning range.

BRIEF DESCRIPTION OF THE DRAWINGS

The following will be apparent from elements of the figures, which are provided for illustrative purposes and are not necessarily to scale.

DETAILED DESCRIPTION

This description of certain exemplary embodiments is intended to be read in connection with the accompanying drawings, which are to be considered part of the entire written description. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. Likewise, terms concerning electrical coupling and the like, such as "coupled," "connected" and "interconnected," refer to a relationship wherein structures communicate with one another either directly or indirectly through intervening structures unless expressly described otherwise.

Figure 1:
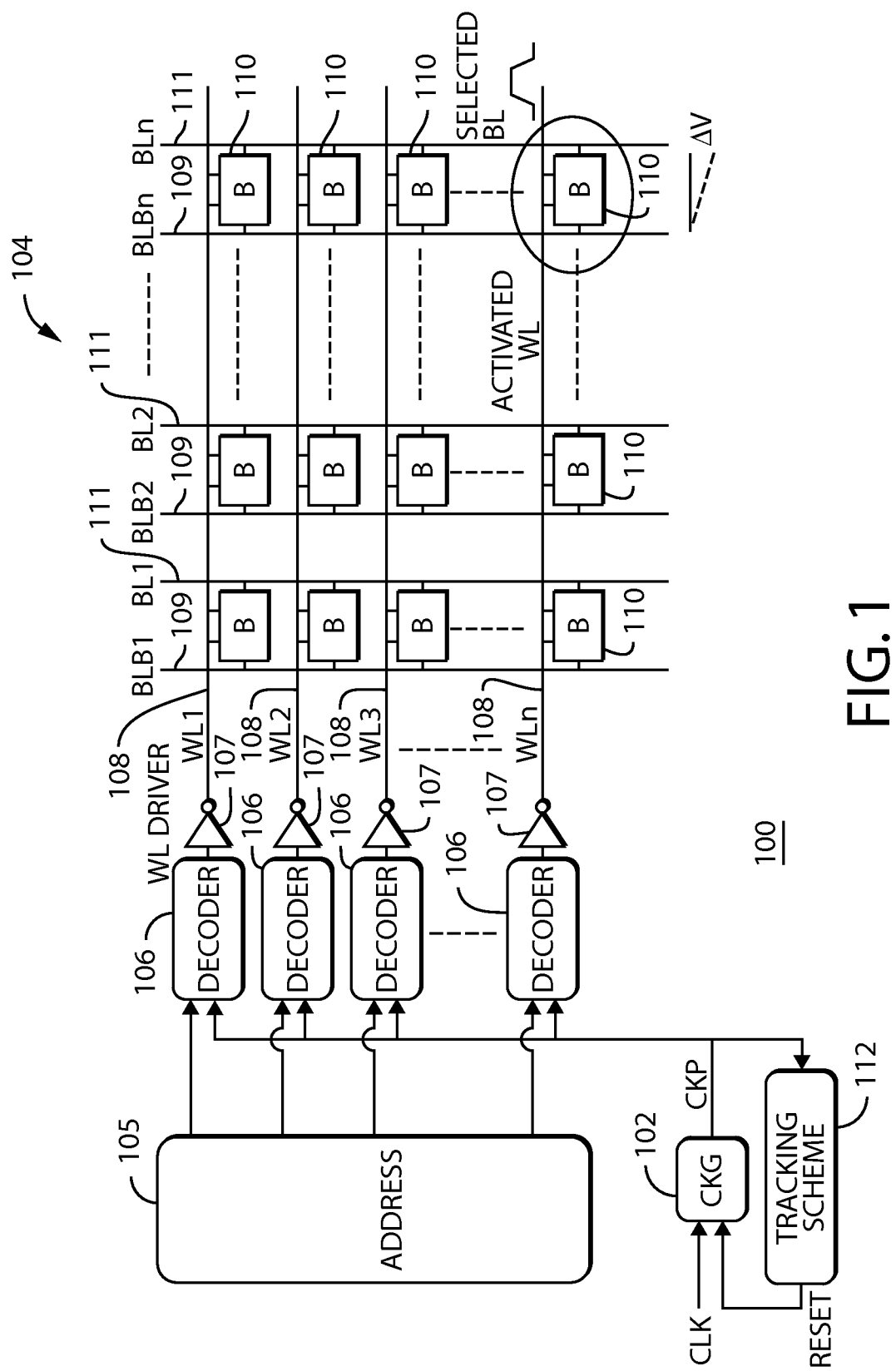
FIG. 1 is a diagram of a self-timed memory.

FIG. 1 illustrates components of a memory 100, such as a SRAM memory. The memory macro 104 includes an array of bit cells 110 connected to wordlines (WL) 108 and bitlines. Specifically, each bit cell 110 is coupled to a bitline (BL) 111 and a complementary bitline (BLB) 109. The wordlines 108 are connected to decoders 106 for addressable access to the wordlines. The decoders 106 decode address signals from address module 105. Decoders 106 are provided with a clock signal CKP. The system is a self-timed system, and clock CKP is the internal clock, which is generated by internal clock generator (CKG) 102 (which may be a finite state machine) using an external clock CLK and a feedback path. The feedback path includes a tracking scheme 112 that uses clock CKP and produces feedback signal RESET. The controller 102 is triggered by the external clock CLK to turn on the wordline 108 of the functional bit cells 110 in the memory macro 104 for accessing the memory macro 104. Each wordline 108 is driven by a wordline driver 107 coupled to the output of a respective decoder 106.

Figure 2A:
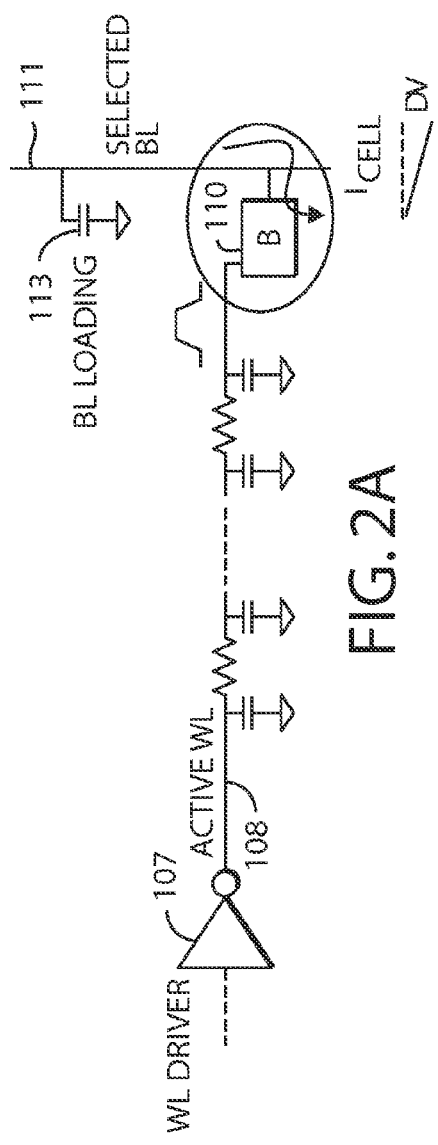
FIG. 2A is a diagram of a row of memory cells in a memory device having a selected memory cell as coupled to the end of a wordline of FIG. 1.

In advanced technologies, backend interconnect resistance and capacitance induced performance degradation is a significant issue. FIG. 2A is a diagram of a row of memory cells in a memory device having a selected memory cell 110 coupled to the end of a wordline of FIG. 1, and the interconnect resistances and capacitances are diagrammatically illustrated as resistors and capacitors. In a self-timed SRAM design, in order to generate a sufficient bitline differential voltage value (ΔV) to ensure a sufficiently robust read sensing function, wordline tracking is employed to track the wordline pulse degradation of a wordline (as shown in FIG. 2A) due to RC delay, and bitline tracking is also employed to track bitline discharging speed due to bitline loading and the cell current of the bit cell 110.

The RC delay of an activated wordline, the loading of the selected bitline and the cell current of a selected bit cell are modeled by a tracking scheme 112 as shown in FIG. 1. The tracking scheme 112 in the feedback path is described in more detail with respect to FIG. 2B. The tracking scheme is utilized to emulate in real-time how long in duration the wordline pulse is needed to turn on the WL 108 of the functional bit cell 110 for establishing sufficient read margin (ΔV) at the BL pairs 109, 111.

As noted above, FIG. 2B is a more detailed view illustrating the tracking scheme of FIG. 1. The internal clock generator 102 provides internal clock CKP from external clock CLK using feedback path signal RESET. Clock CKP is provided to a tracking wordline driver 124, which provides tracking wordline pulse signal TRKWL to the tracking wordline 114. The tracking wordline 114 is designed to model the behavior of the wordline 108 of FIG. 2A. The tracking wordline 114 is driven by the tracking wordline driver 124 to provide a wordline pulse signal TRKWL similar to the pulse signal driven by wordline driver 107 in FIG. 2A. The length of the tracking wordline is substantially the same as the wordline 108 in FIG. 2A, and has substantially the same impedance characteristics (shown as resistances and capacitances 116). A tracking bitline 118 is coupled to a tracking cell 120 and the loading 122 of the tracking bitline 118 is designed to be the same as the bitline loading 113 of the bitline 111 of FIG. 2A. One or more tracking cells 120 are turned on by the tracking wordline 114 to emulate (as tracking cell current Itrkcell) the cell current Icell of the bit cell 110 of FIG. 2A.

Figure 2B:
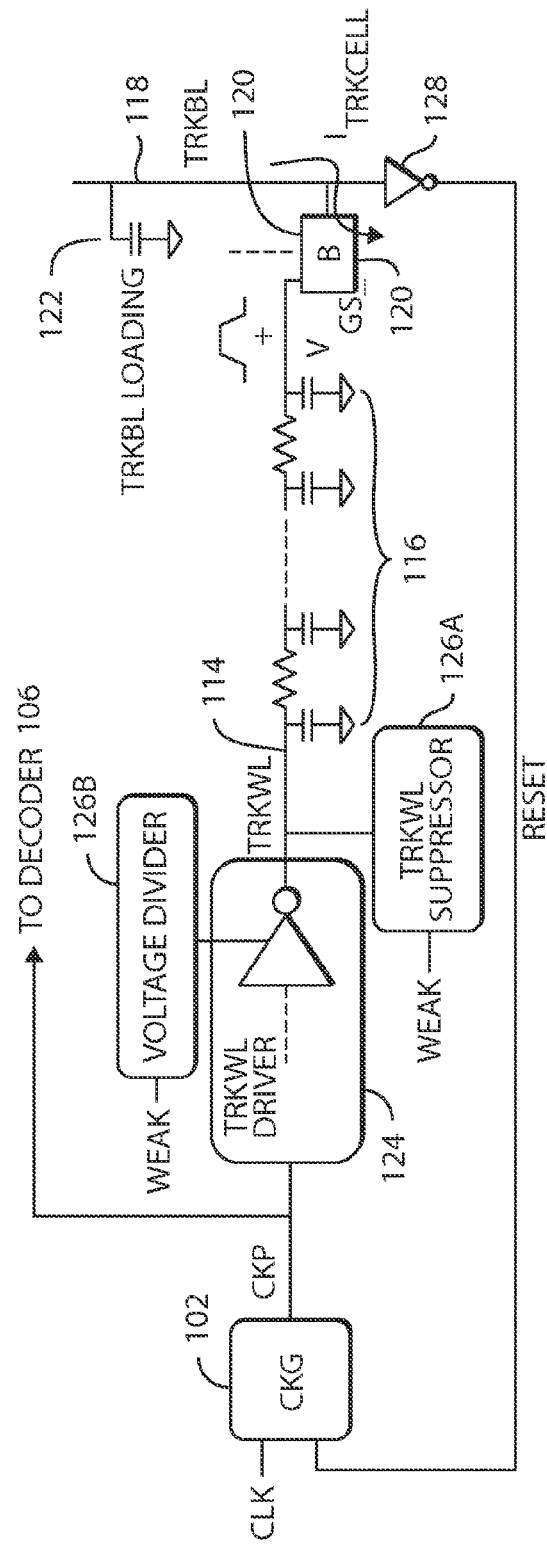
FIG. 2B is a diagram of a tracking scheme for the memory of FIG. 1.

A voltage (Vgs) controls the tracking bitline's discharging speed. With the same bitline loading, a small Vgs results in a small cell current, which corresponds to a slow discharging speed. The RESET signal is fed back to the internal clock generator 102 to later cause the CKP pulse to go low. The wordline pulse can be doubled if Vgs is controlled well. As shown in FIG. 2B, the one or more activated tracking cells 120 collectively provide tracking cell current Itrkcell. The tracking cell current Itrkcell is provided to an inverter 128, which provides the feedback RESET output signal to the internal clock generator (CKG) 102 to turn off the internal clock CKP.

The memory is provided with a control signal WEAK that represents whether the memory is known to have or not have weak bits. The memory includes one or more techniques for extending the wordline pulse width under control of the WEAK control signal. The operation of the tracking scheme for a SRAM macro with normal (not weak) bit cells is described in connection with the timing diagram of FIG. 5A. When the SRAM is to be accessed, external clock signal CLK is provided to internal clock generator CKG (time t1). Signal RESET is low at this point. CKG then outputs internal clock CKP (time t2). At time t3, the tracking wordline signal (TRKWL) goes high, which triggers tracking bitline signal (TRKBL) to go low at time t4. Time point t4 depends on the tracking BL discharging speed, which depends on the tracking BL loading 113 and the tracking cell(s) discharging current Itrkcell. With TRKBL low, the output of inverter 128 (RESET) is high. RESET going high triggers controller CKG to output CKP high for a fixed amount of time, i.e., until time t5 at which point CKP goes low. This fixed amount of time (t5-t2) emulates how long of a WL pulse is needed to turn on the wordline 108 of the functional bit cell 110 for establishing sufficient read margin ($\Delta V$) at the bitline pairs 109, 111. Signal TRKWL goes low shortly thereafter at time t6, which causes signal TRKBL to go high. Also, because CKP is low at time t5, RESET goes low shortly thereafter.

Figure 5A:
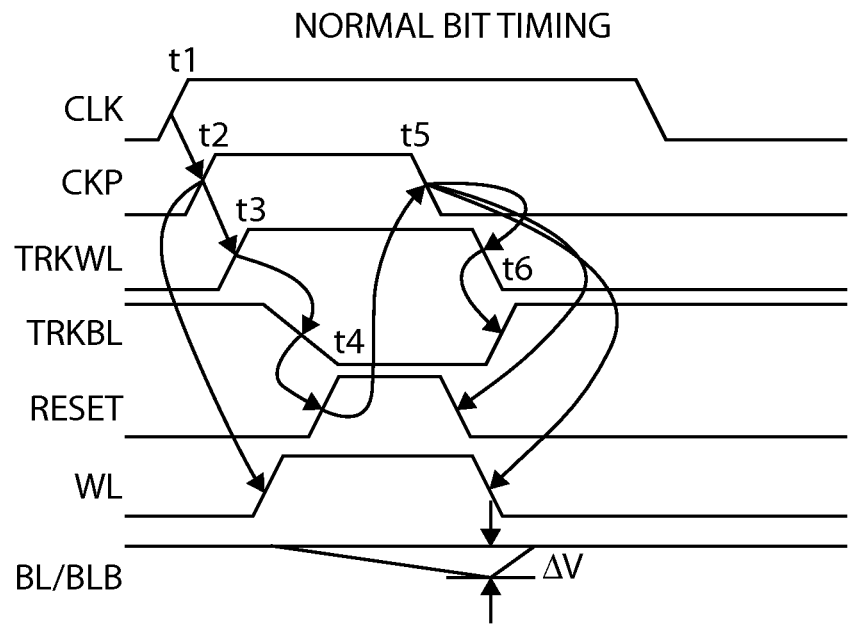
FIG. 5A is a timing diagram for a memory without tracking wordline voltage tuning

Still with reference to FIG. 5A, within the SRAM macro (which has the functional bit cells 110), the wordline signal WL follows internal clock CKP. When WL goes high, the bit cell starts to discharge BL or BLB based on the stored data. Sufficient read margin ($\Delta V$) helps sense amplifier (not shown) to distinguish and read out the data as '1' or '0'. Again, the fixed amount of time (t5-t2) performs the emulation of how long of a WL pulse is needed to turn on the WL 108 of the functional bit cell 110 for establishing sufficient read margin ($\Delta V$) at the BL pairs 109, 111 since data stored in the bit cell node will start to discharge the bit line.

Returning to FIG. 2B, the tracking scheme includes at least one tracking wordline level tuner, such as at least one of (i) tracking WL suppressor 126A coupled to the tracking WL 114 and (ii) voltage divider 126B coupled to the tracking wordline driver 124. One or both of these modules are used when control signal WEAK represents that there are weak bit cells in the memory macro 104.

Figure 3:
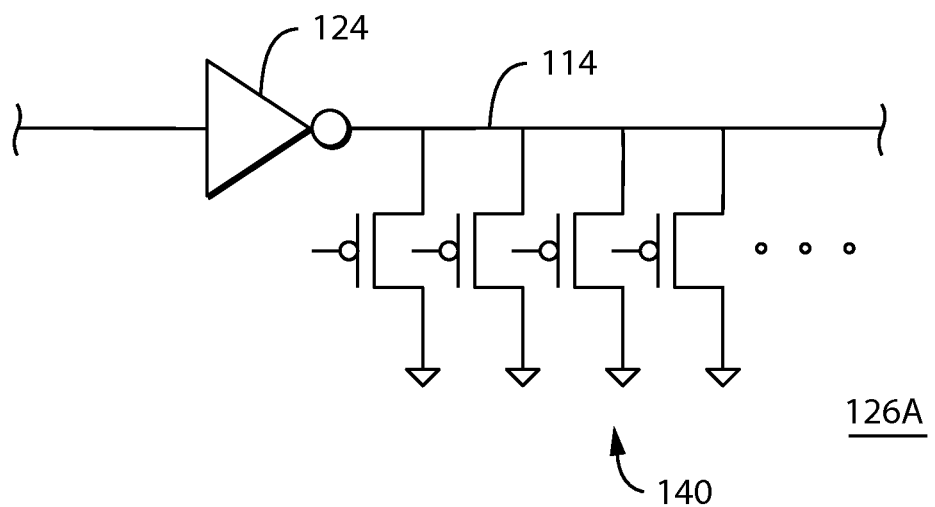
FIG. 3 illustrates an embodiment of a tracking wordline voltage suppressor.

FIG. 3 illustrates one embodiment of a tracking WL suppressor 126A. In this embodiment, one or more pulldown PMOS transistors 140 are connected at their drain terminals to the tracking wordline 114 and at their source terminals to the device's low voltage node (i.e., VSS). The gate terminals are triggered by control signal WEAK, which may be a bus signal. For example, WEAK could be logical high when there is no weak bit cells present in the SRAM macro and low when there are weak bit cells present in the SRAM macro. In this case, WEAK is provided to the gate terminals of the PMOS transistors 140, which turn on when WEAK is low. Of course, if WEAK is low when there are no weak bit cells present and high when there are weak bit cells present in the SRAM macro, then the inversion of WEAK is used at the gate terminals of the pulldown PMOS transistors 140. When the PMOS transistors 140 are "on", the voltage level of TRKWL on the tracking WL 114 is lowered. This, in turn, lowers the Vgs of the bit cells 120 connected to the tracking BL 118, which degrades the tracking cell current (Itrkcell). Weakening the Itrkcell current extends the WL pulse width of the SRAM macro. While transistors 140 are shown as PMOS transistors, it should be understood that these transistors may be NMOS transistors or a mix of NMOS and PMOS transistors as long as properly biased.

The tracking delay increases exponentially with the tracking cell current Itrkcell, which is proportional to $(Vgs-Vt)^2$. Assuming weak bit cells will produce a cell current reduced by 50%, that need twice as much time for the read margin to develop, then the TRKWL voltage level can be reduced by roughly 30% to double the pulse width of WL. Tracking WL suppressor 126A can be designed accordingly with the proper number and size of PMOS transistors 140. Of course, PMOSs 140 can be selectively controlled (i.e., individually turned on/off) to account for different tracking wordline levels based on how weak is the weakest bit cell present in a macro. For example, if the weakest bit cell in the array is a 6-sigma weak bit, then all PMOS transistors may be turned on to reduce Itrkcell to around 50% of a normal bit cell current Icell. Conversely, if the weakest bit in the array is at 2-sigma weak bit level, i.e. the Icell 2-sigma is smaller then normal bit but not fully half of Icell like a 6-simga weak bit, a subset of all of the PMOSs may be turned on. If the weakest bit is a normal bit in array (i.e., there are no weak bits), then all PMOS pull down transistors 140 are off. To account for more than a binary situation (i.e., either all PMOSs on or all off), signal WEAK can be multiple bits or signals sufficient to account for the potential levels of weak bits expected in SRAM macros and appropriate logic can be provided for translating the WEAK control signal into the proper combination of on/off PMOS transistors 140 depending on the actual weak bit level of an individual SRAM macro.

Figure 4:
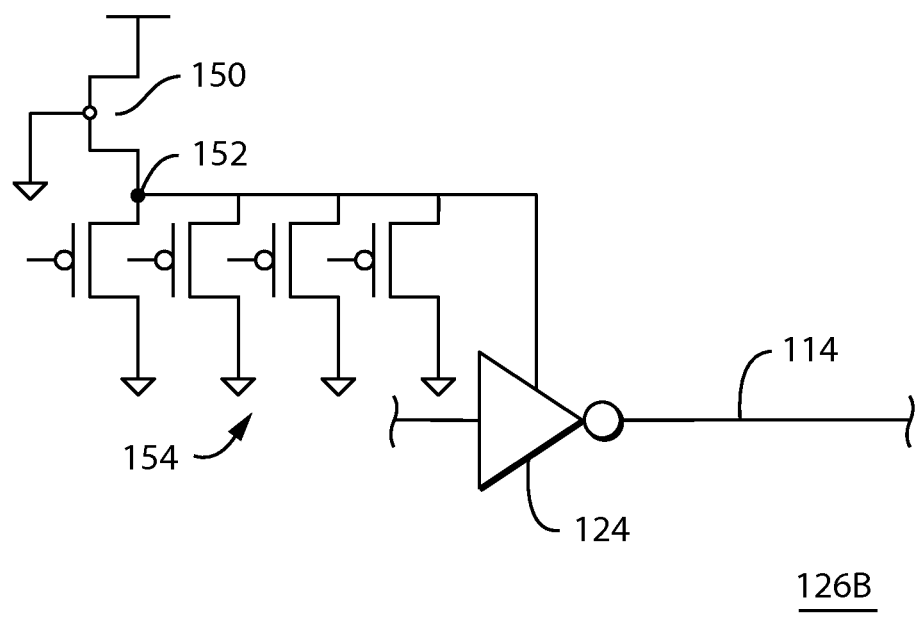
FIG. 4 illustrates an embodiment a voltage divider.

FIG. 4 illustrates an embodiment of a tracking wordline level tuner based on lowering the power domain of the tracking wordline driver 124. Specifically, FIG. 4 illustrates an embodiment of a voltage divider 126B. In this embodiment a voltage divider 126B is coupled between the high power supply node (i.e., VDD) and the power supply node of the tracking wordline driver 124. The voltage divider 126B includes a gate-grounded PMOS transistor 150 coupled between the power supply terminal and a node 152, which is the power supply node of the tracking wordline driver 124. A group of pulldown PMOS transistors 154 is also coupled at their drain terminals to the node 152 and at their source terminals to the low power supply node. These PMOS transistors 154 are turned on by control signal WEAK. When these transistors are turned on the voltage level at node 152 is reduced. Specifically, the gate-grounded PMOS transistor 150 is always on. If PMOSs 154 are off, then node 152 is close to VDD. And if PMOS 154 are all on or partially on (as discussed above), then the level node 152 will be pulled lower based on the fighting between 150 and 154. This, in turn, reduces the voltage level of tracking wordline signal TRKWL. While transistors 150 and 154 are shown as PMOS transistors, it should be understood that these transistors may be NMOS transistors or a mix of NMOS and PMOS transistors as long as properly biased.

It is contemplated that other embodiments may be used to reduce the voltage level of node 152, include diode clamp circuits, resistor dividers or ladders, or using multiple voltage sources selectively coupled to node 152.

Figure 5B:
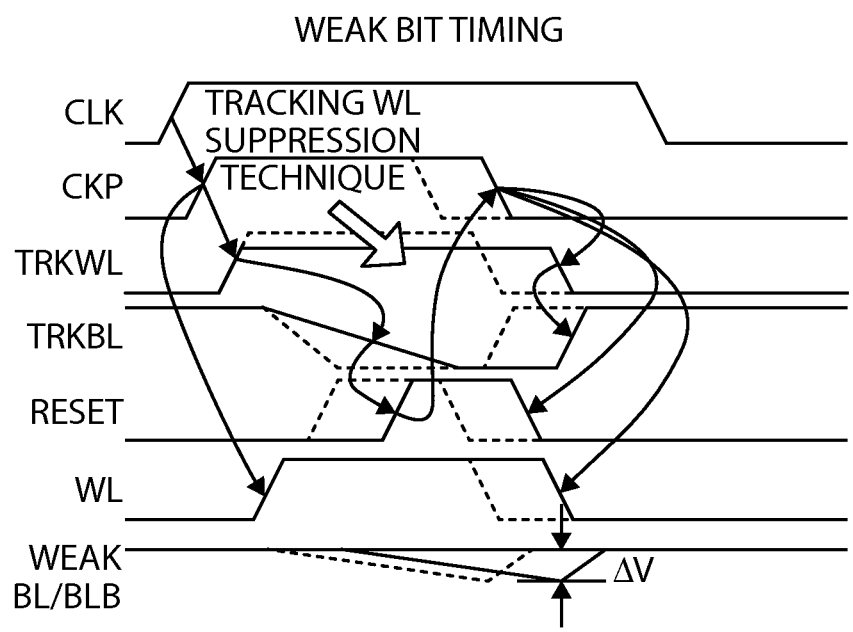
FIG. 5B is a timing diagram for a memory with tracking wordline voltage tuning.

FIG. 5B is a timing diagram illustrating the operation of the tracking scheme for a SRAM macro with weak bit cells. The system operates in the same manner as described above in connection with FIG. 5A only the voltage level of TRKWL is lower than in FIG. 5A. Because the voltage level of TRKWL is lower, Vgs is lower, which reduces Itrkcell. The reduced Itrkcell emulates the cell current of the weakest bit in the array. Because Itrkcell is lower, it takes longer for TRKBL to transition from high to low since the TRKBL loading is fixed but the discharging speed is slower. This delays RESET from going high, which extends the pulse width of CKP. This, in turn, extends the pulse width of wordline signal WL used in access the SRAM macro 104.

This approach to extending the WL pulse width, which does not depend on introducing delay using chains of inverters or multiple feedback paths, reduces the area penalty from tracking while not changing the basic tracking topology. The tracking ratio (tracking cell/Tcd) is also better since the bitcells contribute to the delay. Tcd is memory access time, i.e. clock toggled to output toggled time. Since the processes for manufacturing logic and SRAM are different, e.g., logic might be faster while a bit cell is slower (or vice versa), it is better that the major portion of access time depends on the bit cell itself. In the tracking scheme described herein, the tracking delay is from the bit cell itself by weakening the Itrkcell and not from the logic delay of an inverter chain. An approach using an inverter chain delay might not work well when the process variation of the logic process is different from that of the SRAM process.

Further, the tracking delay increases exponentially since the bit cell current Itrkcell is proportional to $(Vgs-Vt)^2$, meaning there is a wide tuning range. That is, following the square rule, tuning the Vgs will provide a delay proportional to the square of the Vgs. But the delay from an inverter chain is just linear. The approach disclosed herein extends the possible WL pulse wider with very little power impact on the system.

Figure 6:
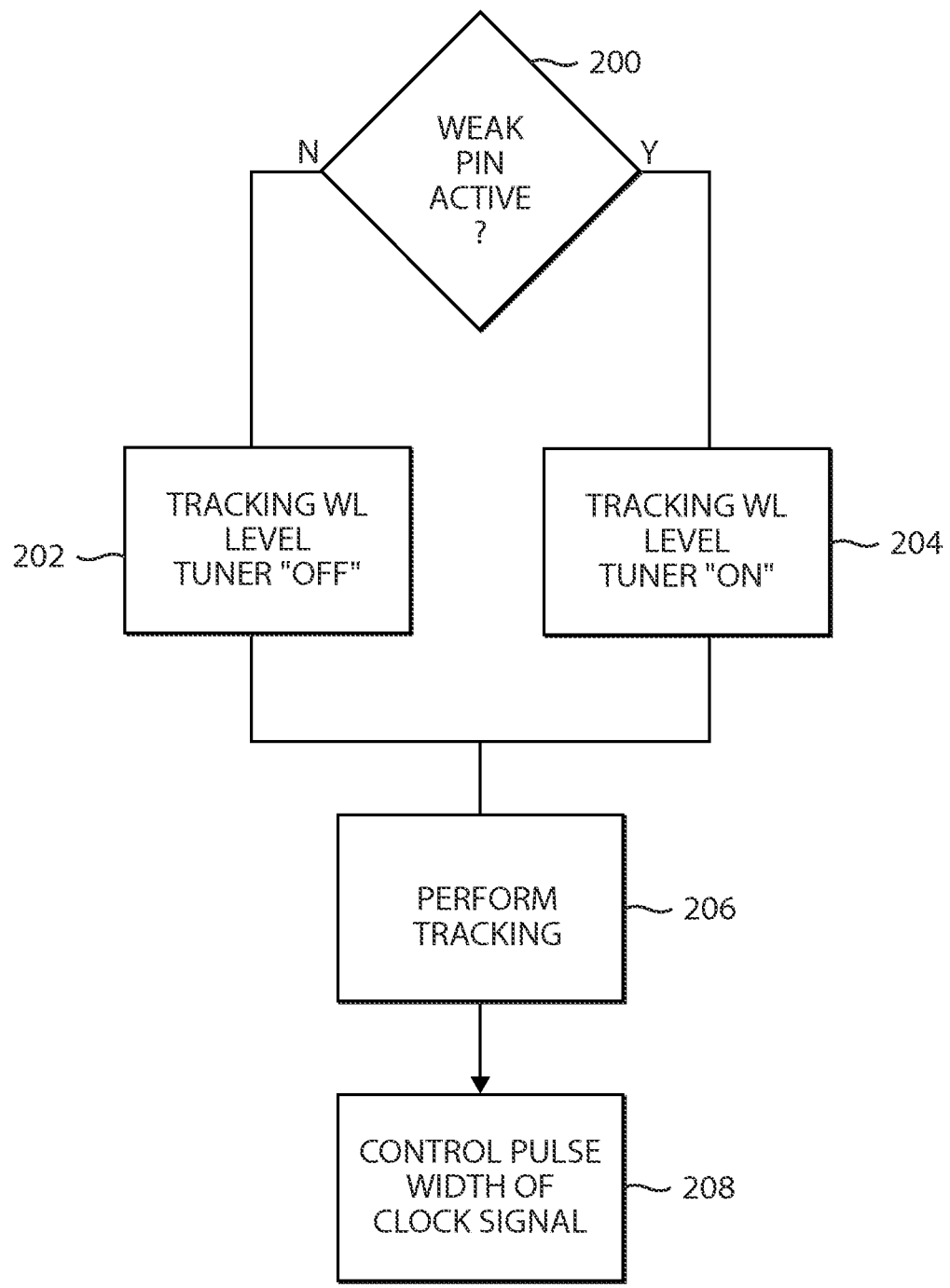
FIG. 6 illustrates a method of performing tracking.

FIG. 6 illustrates a method of performing tracking. At step 200, it is determined whether the WEAK pin (or pins) for the die is active. This indicates if the die includes weak bits (or what level of weak bit) that will need the pulse width of the wordline signal to be extended. At step 202, if the WEAK pin is not active, then the tracking WL level tuner (126A or 126B of FIG. 2) is "off". Tracking is then performed at step 206 with the full voltage level for the signal TRKWL on tracking WL 114. If the WEAK pin is active, however, then at step 204 the tracking WL level tuner is "on" and tracking is performed at step 206 with the reduced voltage level for the signal TRKWL on tracking WL 114. At step 208, the pulse width of the internal clock signal (CKP) is controlled based on the tracking. The internal clock signal is used in accessing a memory cell in the memory macro. Particularly, if there is no weak bit in a macro, the tracking wordline level tuner is "off" and the pulse width of CKP would be smaller but still have the sufficient read margin on the bitline. This allows for the memory macro to have better performance (i.e. faster accessing time).

In certain embodiments, a memory includes a clock generator for providing a first clock signal responsive to a second clock signal and a feedback signal. A feedback loop provides the feedback signal and includes a tracking wordline, a tracking bitline, a tracking bit cell, and a tracking wordline driver for driving the tracking wordline responsive to the first clock signal. The memory includes a tracking wordline level tuner for reducing a voltage level of a tracking wordline signal on the tracking wordline responsive to a weak bit control signal.

In another embodiment, the memory includes a SRAM macro, the SRAM macro using a first clock signal in accessing SRAM memory cells, an internal clock generator for providing the first clock signal responsive to a second clock signal and a feedback signal, and a feedback loop for providing the feedback signal. The feedback loop includes a tracking wordline, a tracking bitline, a tracking bit cell coupled between the tracking wordline and the tracking bitline, a tracking wordline driver for driving the tracking wordline responsive to the first clock signal. The memory also includes a tracking wordline level tuner for reducing a voltage level of a tracking wordline signal on the tracking wordline responsive to a weak bit control signal.

In an embodiment of a method of providing an internal clock signal for a memory using tracking, the method includes the steps of if a weak bit control signal is in a first logic state, driving a tracking wordline of a tracking feedback loop to a first voltage level and if the weak bit control signal is in a second logic state, driving the tracking wordline to a second voltage level, the second voltage level being less than said first voltage level. The method tracks a bit cell current from a tracking bitline coupled to the tracking wordline and controls a pulse width of the internal clock signal based on said tracking.

Although examples are illustrated and described herein, embodiments are nevertheless not limited to the details shown, since various modifications and structural changes may be made therein by those of ordinary skill within the scope and range of equivalents of the claims.

What is claimed is:

1. A memory comprising:
 a clock generator for providing a first clock signal responsive to a second clock signal and a feedback signal;
 a memory array having a plurality of memory cells accessed using the first clock signal; and
 a tracking circuit, the tracking circuit comprising:
  a feedback loop for providing the feedback signal, the feedback loop comprising a tracking wordline, a tracking bitline, a tracking bit cell, and a tracking wordline driver providing a tracking wordline signal for driving the tracking wordline responsive to the first clock signal; and
  a tracking wordline level tuner, the tracking wordline level tuner setting a voltage level of the tracking wordline signal on the tracking wordline to one of at least two voltage levels dependent on a state of a weak bit control signal indicative of the presence of a weak memory cell in the memory array.

2. The memory of claim 1, wherein the tracking wordline level tuner comprises a voltage divider coupled to the tracking wordline driver.

3. The memory of claim 2, wherein the voltage divider comprises one or more pulldown transistors coupled to a supply node of the tracking wordline driver, the pulldown transistors under control of the weak bit control signal.

4. The memory of claim 3, wherein the voltage divider further comprises a transistor coupled between a high power supply node and the supply node of the tracking wordline driver.

5. The memory of claim 4, wherein the transistor is a PMOS transistor having its gate terminal coupled to a low power supply node or a NMOS transistor having its gate terminal coupled to a high power supply node.

6. The memory of claim 2, wherein the tracking wordline level tuner comprises a voltage level suppressor coupled to the tracking wordline.

7. The memory of claim 6, wherein the voltage suppressor comprises one or more pulldovvn transistors coupled to the tracking wordline, the pulldown transistors under control of the weak bit control signal.

8. The memory of claim 7, wherein the pulldown transistors are selected from the group consisting of PMOS transistors, NMOS transistors or a mix of NMOS and PMOS transistors.

9. The memory of claim 1, wherein the tracking wordline level tuner is controllable to set the voltage level of the tracking wordline signal to at least two different reduced voltage levels, the at least two different voltage levels corresponding to different levels of weak bit potentially present in the memory array.

10. The memory of claim 1, further comprising wherein the memory array is part of a SRAM macro.

11. A memory comprising:
   a SRAM macro, the SRAM macro using a first clock signal in accessing SRAM memory cells;
   an internal clock generator for providing the first clock signal responsive to a second clock signal and a feedback signal;
   a feedback loop for providing the feedback signal, the feedback loop comprising a tracking wordline, a tracking bitline, a tracking bit cell coupled between the tracking wordline and the tracking bitline, a tracking wordline driver providing a tracking wordline signal for driving the tracking wordline responsive to the first clock signal; and
   a tracking wordline level tuner, the tracking wordline level tuner setting a voltage level of the tracking wordline signal on the tracking wordline to one of a high driving voltage level or a suppressed driving voltage level dependent on a state of a weak bit control signal indicative of the presence of a weak memory cell in the SRAM macro.

12. The memory of claim 11, wherein the tracking wordline level tuner comprises a voltage divider coupled to the tracking wordline driver.

13. The memory of claim 12, wherein the voltage divider comprises one or more pulldown transistors coupled to a supply node of the tracking wordline driver, the pulldown transistors under control of the weak bit control signal.

14. The memory of claim 13, wherein the voltage divider further comprises a transistor coupled between a high power supply node and the supply node of the tracking wordline driver, wherein the transistor is a PMOS transistor having its gate terminal coupled to a low power supply node or a NMOS transistor having its gate terminal coupled to a high power supply node.

15. The memory of claim 12, wherein the voltage divider is controllable to provide at least two different suppressed driving voltage levels, the at least two different suppressed driving voltage levels corresponding to different levels of weak bit potentially present in the SRAM macro.

16. The memory of claim 11, wherein the tracking wordline level tuner comprises a voltage level suppressor coupled to the tracking wordline.

17. The memory of claim 16, wherein the voltage suppressor comprises one or more pulldown transistors coupled to the tracking wordline, the pulldown transistors under control of the weak bit control signal.

18. The memory of claim 16, wherein the voltage level suppressor is controllable to provide at least two different suppressed driving voltage levels, the at least two different suppressed driving voltage levels corresponding to different levels of weak bit potentially present in the SRAM macro.

19. A method of providing an internal clock signal for a memory using tracking, comprising the steps of:
   receiving a weak bit control signal indicative of the presence of a weak memory cell in a memory array;
   if the weak bit control signal is in a first logic state indicating no weak memory cell, driving a tracking wordline of a tracking feedback loop to a first voltage level;
   if the weak bit control signal is in a second logic state indicating the weak memory cell is present, driving the tracking wordline to a second voltage level, the second voltage level being less than said first voltage level;
   tracking a bit cell current from a tracking bitline coupled to the tracking wordline; and
   controlling a pulse width of the internal clock signal based on said tracking.

20. The method of claim 19, further comprising the steps of accessing a memory cell using the internal clock signal.

* * * * *

UNITED STATES PATENT AND TRADEMARK OFFICE
CERTIFICATE OF CORRECTION

PATENT NO.        : 9,111,595 B2          Page 1 of 1
APPLICATION NO.   : 13/904653
DATED             : August 18, 2015
INVENTOR(S)       : Yu-Hao Hsu et al.

It is certified that error appears in the above-identified patent and that said Letters Patent is hereby corrected as shown below:

IN THE CLAIMS:

Claim 7, Column 7, Line 7, delete "pulldovvn" and insert -- pulldown --.

Claim 10, Column 7, Line 20, delete "further comprising".

Signed and Sealed this
Thirty-first Day of May, 2016

Michelle K. Lee
*Director of the United States Patent and Trademark Office*